United States Patent [19]
Klein

[11] Patent Number: 5,113,147
[45] Date of Patent: May 12, 1992

[54] WIDE-BAND DIFFERENTIAL AMPLIFIER USING GM-CANCELLATION

[75] Inventor: Hans W. Klein, Pleasanton, Calif.

[73] Assignee: Minnesota Mining and Manufacturing Company, St. Paul, Minn.

[21] Appl. No.: 588,981

[22] Filed: Sep. 26, 1990

[51] Int. Cl.⁵ ............................................. H03F 3/45
[52] U.S. Cl. .................................. 330/253; 330/257
[58] Field of Search ............... 330/253, 257, 277, 288, 330/296, 261, 252

[56] References Cited

U.S. PATENT DOCUMENTS 4,720,685 1/1988 Garuts ........................... 330/253 X Primary Examiner—Steven J. Mottola
Attorney, Agent, or Firm—Gary L. Griswold; Walter N. Kirn; William B. Barte

[57] ABSTRACT

A wide-band differential amplifier includes four MOS transistors connected in a source-follower configuration for gm-cancellation. Accurate gain and low distortion of the amplified signals results over the frequency band.

1 Claim, 1 Drawing Sheet

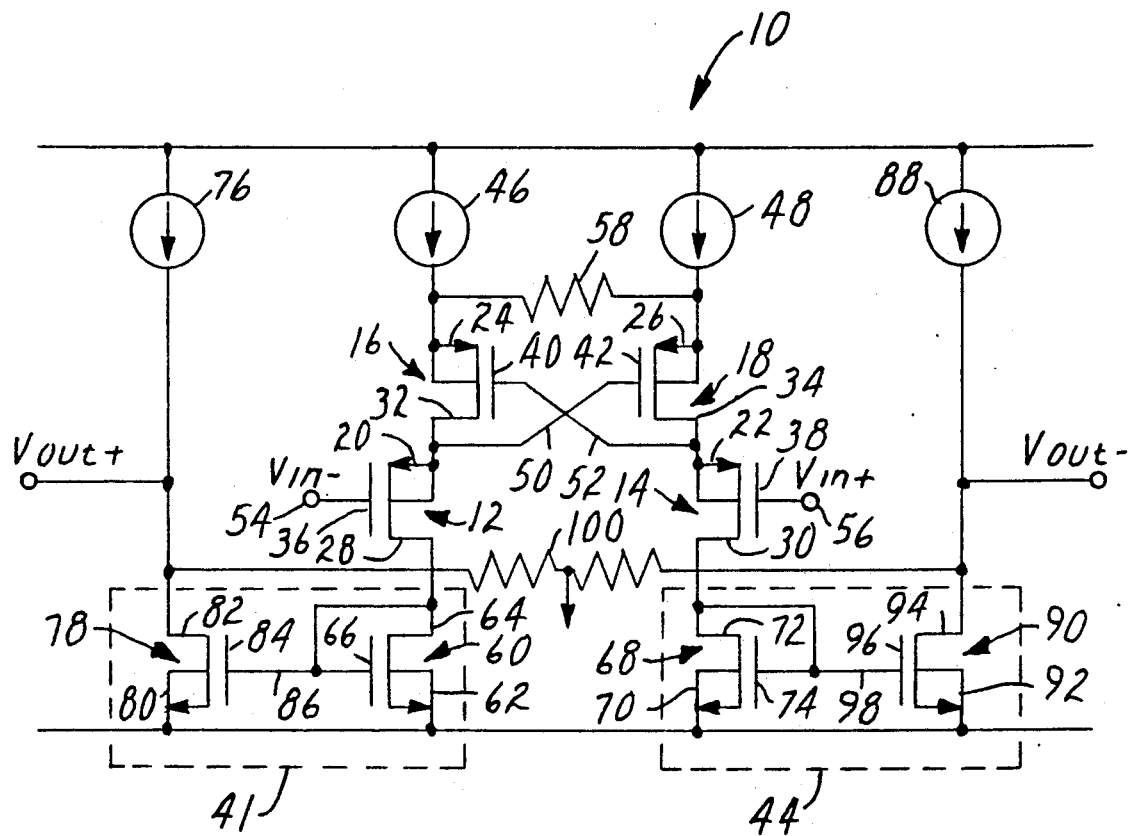

WIDE-BAND DIFFERENTIAL AMPLIFIER USING GM-CANCELLATION

BACKGROUND OF THE INVENTION

This invention relates generally to differential amplifiers, and more particularly the invention relates to a differential amplifier having accurate gain over a wide bandwidth with low signal distortion.

Conventional wide-band MOS transistors and amplifiers are discussed by John M. Steininger in "Understanding Wide-Band MOS Transistors," *IEEE Circuits and Systems*, May 1990, pp. 26–31. Conventional MOS differential amplifiers have current sources which introduce current imbalance which leads to distortion by variations of the operating conditions.

SUMMARY OF THE INVENTION

The present invention is an MOS wide-band differential amplifier having accurate gain with low signal distortion.

A feature of the invention is a source-follower configuration of four input transistors which achieves gm-cancellation and fully cancels out any distortion introduced by variation of operating conditions.

The invention and objects and features thereof will be more fully understood from the following description and appended claims when taken with the drawing.

BRIEF DESCRIPTION OF THE DRAWING

The drawing is a schematic of a differential amplifier in accordance with the preferred embodiment of the invention.

DETAILED DESCRIPTION OF ILLUSTRATIVE EMBODIMENTS

Referring now to the drawing, the amplifier 10 in accordance with the invention has four MOS transistors, 12, 14, 16, and 18, each of which has a source (20, 22, 24, and 26, respectively), a drain (28, 30, 32, and 34), respectively, and a gate (36, 38, 40, and 42), respectively. The first and third transistors 12 and 16 are serially connected in a source follower configuration with a first current source 46 and a first current mirror 41 which includes a fifth MOS transistor 60, also including a source 62, drain 64, and gate 66. Likewise, the second and fourth transistors 14 and 18 are serially connected in a source follower configuration with a second current source 48 and a second current mirror 44 which includes a sixth MOS transistor 68 having a source 70, drain 72, and gate 74. The differential inputs to the amplifier, $-V_{in}$ and $+V_{in}$ are applied to the gates of the first and second transistors 12 and 14, respectively, while the gates of the third and fourth transistors 16 and 18, respectively, are cross-coupled to the sources of the transistors 14 and 12. A first resistor Rd1 (also identified as element 58) is coupled between the sources of the third and fourth transistors 16 and 18.

The amplifier further includes a third current source 76, which is serially connected with a seventh MOS transistor 78, also having a source 80, drain 82, and gate 84, and which forms a part of the first current mirror 41. Also, the first current mirror 41 includes a connection between the gates 66 and 84 of the fifth and seventh transistors 60 and 78 to effect mirroring the currents in the respective transistors. Similarly, a fourth current source 88 is serially coupled with an eighth MOS transistor 90, also having a source 92, drain 94, and gate 96 and which forms a part of the second current mirror 44. The current mirror also includes a lead 98 between the bases 74 and 96 of the sixth and eighth transistors 68 and 90, respectively.

Finally, a second resistor Rd2 (100) is connected between the drains 82 and 94 of the seventh and eighth transistors 78 and 90, the outputs of the amplifier then being taken across the resistor Rd2 (100) at the drains 82 and 94 of the seventh and eighth transistors 78 and 90. The third and fourth current sources 76 and 88 thus generate currents which are a function of Vcm taken from the second resistor 100.

The configuration in this amplifier provides total cancellation of gm which results in a voltage drop across Rd1 (58) which is identical to the differential signal at the amplifiers inputs. Hence, the nonlinearity of the transistors (especially when applied to large signals) is fully canceled. The AC current through Rd1 (58) is then amplified by means of the programmable current mirror ratio and is dumped into the second resistor Rd2 (100) at the output stage. The gain of the circuit is (Rd2/Rd1) A, with the value A being the current mirror ratio.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

I claim:

1. A wide-band differential amplifier comprising:
   first, second, third and fourth MOS transistors (12, 14, 16, and 18) each having a source, a drain, and a gate,
   a first current mirror having a fifth MOS transistor having a source, drain, and gate connected to the drain of said first transistor,
   a second current mirror having a sixth MOS transistor having a source, drain, and gate connected to the drain of said second transistor,
   a first current source serially connected with said third transistor, said first transistor and said first current mirror,
   a second current source serially connected with said fourth transistor, said second transistor, and said second current mirror,
   means connecting said gate of said third transistor to said source of said second transistor, and means connecting said gate of said fourth transistor to said source of said first transistor,
   means for applying a first input ($-V_{in}$) to said gate of said first transistor and means for applying a second input ($+V_{in}$) to said gate of said second transistor,
   a first resistor Rd1, connected between said source of said third transistor and said source of said fourth transistor,
   a third current source serially connected with a seventh MOS transistor having a source, drain, and gate, and which forms a part of said first current mirror,
   means connecting said gates of said fifth and seventh transistors of said first current mirror,
   a fourth current source serially connected with an eighth MOS transistor having a source, drain, and gate, and which forms a part of said second current mirror,
   means connecting said gates of said sixth and eighth transistors of said second current mirror, and
   a second resistor, Rd2, connected between said drains of said seventh and eighth transistors, the outputs of said amplifier being taken at said drains of said seventh and eighth transistors.

* * * * *